(12) United States Patent
Liu et al.

(10) Patent No.: US 8,808,789 B2
(45) Date of Patent: Aug. 19, 2014

(54) PROCESS FOR FORMING CONDUCTIVE FEATURES

(75) Inventors: Ping Liu, Ontario (CA); Yiliang Wu, Ontario (CA); Nan-Xing Hu, Ontario (CA); Anthony Wigglesworth, Oakville (CA)

(73) Assignee: Xerox Corporation, Norwalk, CT (US)

( * ) Notice: Subject to any disclaimer, the term of this patent is extended or adjusted under 35 U.S.C. 154(b) by 183 days.

(21) Appl. No.: 12/617,840

(22) Filed: Nov. 13, 2009

(65) Prior Publication Data

US 2011/0115086 A1    May 19, 2011

(51) Int. Cl.
| | | |
|---|---|---|
| *B05D 5/12* | (2006.01) | |
| *B05D 3/00* | (2006.01) | |
| *H01L 29/66* | (2006.01) | |
| *H01L 29/45* | (2006.01) | |
| *H01L 27/12* | (2006.01) | |

(52) U.S. Cl.
CPC ....... *H01L 29/66742* (2013.01); *H01L 27/1214* (2013.01); *H01L 29/458* (2013.01)
USPC .......... 427/96.1; 427/120; 427/123; 427/335; 427/336; 427/337; 427/383.1

(58) Field of Classification Search
USPC .............. 427/96.1, 120, 123, 383.1, 335–337
See application file for complete search history.

(56) References Cited

U.S. PATENT DOCUMENTS

| | | | |
|---|---|---|---|
| 4,353,741 A * | 10/1982 | Capuano et al. | 549/534 |
| 4,508,756 A * | 4/1985 | Senda et al. | 427/81 |
| 7,270,694 B2 * | 9/2007 | Li et al. | 75/351 |
| 7,306,969 B2 | 12/2007 | Wu et al. | |
| 7,494,608 B2 | 2/2009 | Li et al. | |
| 8,057,849 B2 * | 11/2011 | Liu et al. | 427/71 |
| 2005/0129843 A1 | 6/2005 | Wu et al. | |
| 2006/0189113 A1 * | 8/2006 | Vanheusden et al. | 438/597 |
| 2007/0099357 A1 * | 5/2007 | Li et al. | 438/149 |
| 2007/0128905 A1 | 6/2007 | Speakman | |
| 2008/0085594 A1 * | 4/2008 | Li et al. | 438/597 |
| 2009/0140336 A1 | 6/2009 | Li | |
| 2009/0181177 A1 * | 7/2009 | Li et al. | 427/383.1 |
| 2010/0034693 A1 * | 2/2010 | Li | 420/501 |

* cited by examiner

*Primary Examiner* — Brian K Talbot
(74) *Attorney, Agent, or Firm* — Fay Sharpe LLP

(57) ABSTRACT

Methods and compositions for preparing highly conductive electronic features are disclosed. When organoamine-stabilized silver nanoparticles are exposed to an alkaline composition, the resulting electronic feature is highly conductive. Such methods are particularly advantageous when applied to aged silver nanoparticle compositions.

9 Claims, 2 Drawing Sheets

PROCESS FOR FORMING CONDUCTIVE FEATURES

BACKGROUND

Disclosed herein, in various embodiments, are compositions and processes for making stable, high performing electronic features useful in various electronic devices.

Fabrication of electronic circuit elements using liquid deposition techniques may be beneficial as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge.

The metal, silver, is of particular interest as conductive elements for electronic devices because silver is much lower in cost than gold and it possesses much better environmental stability than copper. Silver nanoparticles have attracted extensive interest for making highly conductive features at low annealing temperatures. However, there are two major challenges associated with current silver nanoparticles. First, to allow their use on a wide range of flexible plastic substrates, a low processing temperature, ideally below 120° C., is preferred to maintain the dimensional stability of the flexible substrates. Second, it has been difficult to develop silver nanoparticles that have a processing temperature below 120° C. while still having sufficient shelf-life stability. Generally, annealed films or printed lines obtained from aged silver nanoparticle compositions suffer significant loss in conductivity. It would be desirable to develop compositions and processes that allow aged compositions to have the same high level of conductivity as freshly prepared compositions at low processing temperatures.

BRIEF DESCRIPTION

The present application discloses, in various exemplary embodiments, processes for preparing metal nanoparticle compositions, as well as the compositions so produced. Devices which use the nanoparticle compositions, such as thin film transistors, are also disclosed.

In some embodiments a conductive feature on an electronic device is formed by a process comprising: depositing a composition upon a substrate, the composition comprising metal nanoparticles with an organic stabilizer on the surface thereof, resulting in a deposited composition; heating the deposited composition; and exposing the deposited composition to an alkaline composition, resulting in the formation of the conductive feature.

The alkaline composition may comprise sodium hydroxide, potassium hydroxide, calcium hydroxide, magnesium hydroxide, ammonia, sodium carbonate, sodium acetate, an organoamine, imidazole, pyridine, and mixtures thereof. In particular embodiments, the alkaline composition comprises ammonia, water, and an organic solvent.

The conductive feature can have a conductivity of at least 10,000 S/cm.

The heating may be performed at a temperature of from about 70° C. to about 130° C., 80° C. to about 120° C., or at a temperature below 100° C. The deposited composition can be either heated prior to the exposure to the alkaline composition or heated after to the exposure to the alkaline composition. The heating may occur for a period of from about 3 minutes to about 1 hour.

The organic stabilizer may be a thiol, an amine, a carboxylic acid or carboxylate, polyethylene glycol, or a pyridine derivative In particular embodiments, the stabilizer is an organoamine, specifically dodecylamine.

Also disclosed in other embodiments is a process for making a conductive feature on an electronic device, comprising: depositing a composition upon a substrate, the composition comprising metal nanoparticles with an organic stabilizer on the surface thereof, resulting in a deposited composition; heating the deposited composition; and exposing the deposited composition to an alkaline composition, resulting in the formation of the conductive feature.

The heating of the deposited composition and the exposing of the deposited composition to an alkaline composition may be concurrent. Alternatively, the deposited composition can be exposed to the alkaline composition prior to the heating, or the deposited composition can be heated prior to the exposure to the alkaline composition.

The heating may be at a temperature of from about 70° C. to about 130° C., or at a temperature below 100° C. The heating may occur for a period of from about 3 minutes to about 1 hour.

Also disclosed in embodiments is a process or a method for both of increasing the conductivity of a feature on an electronic device and reducing the annealing temperature needed when heating the deposited composition. The process comprises providing a composition comprising metal nanoparticles with an organoamine stabilizer on the surface thereof; depositing the composition on a substrate, resulting in a deposited composition; heating the deposited composition; and exposing the deposited composition to an alkaline composition, resulting in the formation of the conductive feature.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
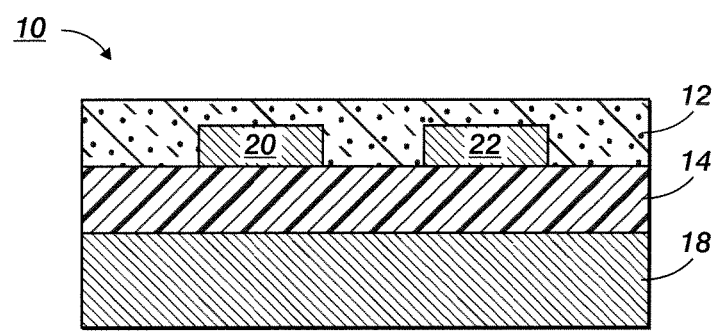
FIG. 1 represents a first embodiment of a thin film transistor fabricated according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "metal nanoparticles" indicates a particle size of less than about 1000 nm. In embodiments, the metal nanoparticles have a particle size of from about 1 nm to about 1000 nm, from about 1 nm to about 500 nm, from about 1 nm to about 100 nm, and particularly from about 1 nm to about 20 nm. Unless otherwise indicated, the particle size is defined herein as the average diameter of the particles, excluding any stabilizer on the surface thereof, as determined by TEM (transmission electron microscopy).

The present disclosure relates to metal nanoparticle compositions that are useful for the production of electrically conductive features. The compositions may advantageously be deposited on a variety of substrates and processed into electrically conductive features at low temperatures (i.e. below 120° C.).

The processes of the present disclosure produce highly conductive electronic features on a substrate of an electronic device, for example as an electrode on a thin film transistor. Generally, the processes comprise the use of a metal nanoparticle composition, which is deposited upon a substrate. The deposited composition is subjected to a basic (alkaline) medium. The deposited composition is also heated or dried to form a conductive feature. The heating and the exposure to the basic medium can be in any order. In particular, one advantage of these processes is that metal nanoparticle compositions which may have aged by being stored for an extended period of time can be used to form a conductive feature that has a conductivity similar to that obtained when a freshly prepared metal nanoparticle composition is used to form the conductive feature.

Metal nanoparticles may be prepared by any suitable method such as chemical methods and physical methods. For example, silver colloidal nanoparticles of about 5-7 nm in size may be made by physical methods such as that disclosed in C. Hayashi, "Ultrafine Particles", *J. Vacuum Sci. Technol. A*, Vol. 5, No. 4, pp. 1375-1384 (July/August 1987), the disclosure of which is totally incorporated herein by reference.

Chemical methods of making a composition comprising silver-containing nanoparticles in embodiments can involve mixing a silver compound with an initial stabilizer in an aqueous or non-aqueous medium with vigorous agitation, followed by the addition of a reducing agent. Any suitable chemical methods may be used for making a composition comprising metal nanoparticles with molecules of an initial stabilizer on the surface of the metal nanoparticles such as the representative methods disclosed in the following documents (the disclosures of which are totally incorporated herein by reference):

Yiliang Wu et al., U.S. application Ser. No. 11/187,552, filed Jul. 22, 2005, titled "METHODS TO MINIMIZE CONTACT RESISTANCE."

Y. Wu, Y. Li, and B. S. Ong, "Printed Silver Ohmic Contacts for High-Mobility Organic Thin-Film Transistors", *J. Am. Chem. Soc.*, vol. 128, 4202-4203 (2006).

X. Z. Lin, X. Teng, H. Yang, "Direct Synthesis of Narrowly Dispersed Silver Nanoparticles Using a Single-Source Precursor", *Langmuir*, vol. 19, 10081-10085 (2003), wherein X. Z. Lin et al reported synthesis of oleic acid-stabilized silver nanoparticles by heating silver trifluoroacetate in the presence of oleic acid in isoamylamine at 160 degrees C.

Y. Wu, Y. Li, and B. S. Ong, "Printed Silver Ohmic Contacts for High-Mobility Organic Thin-Film Transistors", *J. Am. Chem. Soc.*, vol. 128, 4202-4203, (2006), wherein Y. Wu et al described a method of preparing silver nanoparticles stabilized with oleic acid by reducing silver acetate using phenylhydrazine in the presence of oleic acid in toluene at a lower temperature (60 degrees C.).

The metal of the nanoparticles of the compositions of the present invention may be selected from transition metals as well as main group metals such as, e.g., silver, gold, copper, nickel, cobalt, palladium, platinum, indium, tin, zinc, titanium, chromium, tantalum, tungsten, iron, rhodium, iridium, ruthenium, osmium and lead. Non-limiting examples of desirable metals include silver, gold, copper, nickel, cobalt, rhodium, palladium and platinum. Silver, copper and nickel are particularly preferred metals, and silver is the most preferred metal.

In embodiments, the metal nanoparticles are composed of elemental silver or silver composites, i.e. are silver-containing nanoparticles. Besides silver, the silver composites may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising, for example, at least about 20% of the nanoparticles by weight, particularly greater than about 50% of the nanoparticles by weight.

Any suitable procedures can be used for fabricating silver composite nanoparticles such as the procedures described in S. Link, Z. L Wang, and M. A. El-Sayed, "Alloy Formation of Gold-Silver Nanoparticles and the Dependence of the Plasmon Absorption on Their Composition", J. Phys. Chem. vol. 103, 3529-3533 (1999), the disclosure of which is totally incorporated herein by reference, wherein S. Link et al. describes a method of preparing silver-gold alloy nanoparticles with an average diameter of 17-18 nm by refluxing chlorauric acid ($HAuCl_4$) and silver nitrate ($AgNO_3$) in aqueous sodium citrate solution.

The metal nanoparticles are stabilized by the presence of a stabilizer on their surface. The stabilizer has the function of minimizing or preventing the metal nanoparticles from aggregating, and provides or enhances the solubility or dispersibility of the metal nanoparticles in a liquid. In embodiments, the stabilizer is "thermally removable," meaning that the stabilizer dissociates from the surface of the metal nanoparticles under certain conditions such as through heating, laser radiation, and combinations thereof.

In embodiments, the stabilizer is an organic stabilizer. The term "organic" in "organic stabilizer" refers to the presence of carbon atoms(s), but the organic stabilizer may further include one or more non-metal heteroatoms such as nitrogen, oxygen, sulfur, silicon, halogen, and the like. Exemplary organic stabilizers include thiol and its derivatives, amine and its derivatives, carboxylic acid and its carboxylate derivatives, polyethylene glycols, and other organic surfactants. In embodiments, the organic stabilizer is selected from the group consisting of a thiol such as butanethiol, pentanethiol, hexanethiol, heptanethiol, octanethiol, decanethiol, and dodecanethiol; an amine such as ethylamine, propylamine, butylamine, pentylamine, hexylamine, heptylamine, octylamine, nonylamine, decylamine, dodecylamine and hexyldecylamine; a dithiol such as 1,2-ethanedithiol, 1,3-propanedithiol, and 1,4-butanedithiol; a diamine such as ethylenediamine, 1,3-diaminopropane, 1,4-diaminobutane; a mixture of thiol and a dithiol; and a mixture of an amine and a diamine. Organic stabilizers containing a pyridine derivative, for example dodecyl pyridine, and/or organophosphine that can stabilize silver-containing nanoparticles can also be selected.

The stabilizer is, in embodiments, an organoamine such as butylamine, pentylamine, hexylamine, heptylamine, octylamine, nonylamine, decylamine, undecylamine, dodecylamine, tridecylamine, tetradecylamine, pentadecylamine, hexadecylamine, oleylamine, octadecylamine, diaminopentane, diaminohexane, diaminoheptane, diaminooctane, diaminononane, diaminodecane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and mixtures thereof. In specific embodiments, the organoamine stabilizer has from about 6 to about 18 carbon atoms. In other embodiments, the organoamine stabilizer has from about 8 to about 18 carbon atoms. In other specific embodiments, the organoamine is dodecylamine.

Examples of other organic stabilizers include, for example, thiol and its derivatives, —OC(=S)SH (xanthic acid), polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize metal nanoparticles may also be used as a potential stabilizer.

Further examples of organic stabilizers may include: the carboxylic acid-organoamine complex stabilized metal nanoparticles, described in U.S. Patent Application Pub. No. 2009/0148600 A1; the carboxylic acid stabilizer metal nanoparticles described in U.S. Patent App. Pub. No. 2007/0099357 A1, and the thermally removable stabilizer and the UV decomposable stabilizers described in U.S. Patent Application Pub. No. 2009/0181183 A1, each of which is incorporated by reference herein in its entirety.

In embodiments where two or more stabilizers may be used, each stabilizer may be present at any suitable weight or molar ratios, such as a first stabilizer:second stabilizer ratio of about 99:1 to about 1:99. The total amount of the stabilizer can be any suitable amount such as 1, to 20 (or more) molar equivalents of stabilizer per mole of metal compound.

Any suitable liquid(s) or solvent(s) may be used in the present process to help disperse or dissolve the metal nanoparticles and form a metal nanoparticle-containing composition (i.e. solution or dispersion). Suitable liquids include organic solvents and/or water. Exemplary organic solvents include for example hydrocarbon solvents such as ISOPAR® fluids, pentane, hexane, cyclohexane, heptane, octane, nonane, decane, undecane, dodecane, tridecane, tetradecane, toluene, xylene, mesitylene, and the like; alcohols such as methanol, ethanol, propanol, butanol and the like; tetrahydrofuran, chlorobenzene, dichlorobenzene, trichlorobenzene, nitrobenzene, cyanobenzene, acetonitrile, and mixtures thereof.

The metal nanoparticles may be from about 5% to about 98% by weight of the metal nanoparticle-containing composition. Put another way, the amount of liquid used may be from about 2% to about 95% by weight, particularly from about 10% to about 95% by weight of the metal nanoparticle-containing composition. In particular embodiments, the metal nanoparticles are from about 10 to about 25 weight percent of the metal nanoparticle-containing composition.

The fabrication of conductive elements from the present metal nanoparticle compositions (in embodiments these compositions can be referred to as "inks") can be carried out using any suitable liquid deposition technique including (i) printing such as screen/stencil printing, stamping, microcontact printing, ink jet printing and the like, and (ii) coating such as spin-coating, dip coating, blade coating, casting, dipping, and the like. The deposited metal nanoparticle features at this stage may or may not exhibit electrical conductivity.

In some processes, the deposited metal nanoparticle composition is then heated while being concurrently exposed to a basic (alkaline) composition, solution, or medium to form a conductive feature. In other words, the heating and the exposure to alkaline composition are concurrent.

In other processes, the deposited metal nanoparticle composition is exposed to an alkaline composition, then heated to form a conductive feature. In other words, the deposited composition is exposed to the alkaline composition prior to the heating.

In other processes, the deposited metal nanoparticle composition is heated to form a feature, then exposed to an alkaline composition, then dried by storing the feature in air without heating or dried by heating to obtain a conductive feature. In other words, the deposited composition is exposed to the alkaline composition after the heating.

The basic or alkaline composition may be a pure base, or a base that is diluted or dissolved in suitable solvents. Generally speaking, the basic composition is chosen so that it will not damage the deposited metal nanoparticle features. The alkaline composition can be a gas or a liquid, comprising any suitable base or an alkaline component with any suitable solvent. In embodiments, the solvent for the basic composition may be water or any other suitable common organic solvent such as a hydrocarbon solvent like ISOPAR® fluids, pentane, hexane, cyclohexane, heptane, octane, nonane, decane, undecane, dodecane, tridecane, toluene, xylene, mesitylene, and the like; an alcohol such as methanol, ethanol, propanol, butanol, terpineol and the like; a ketone like acetone, methyl isobutyl ketone and the like; an ether, tetrahydrofuran, chlorobenzene, dichlorobenzene, trichlorobenzene, nitrobenzene, cyanobenzene, acetonitrile, and mixtures thereof.

The base itself may be a strong base such as sodium hydroxide, potassium hydroxide, calcium hydroxide, magnesium hydroxide, and the like; a weak base such as ammonia, sodium carbonate, sodium acetate, an organoamine, imidazole, pyridine, and mixtures thereof. In embodiments, the alkaline composition is an aqueous solution of ammonium hydroxide, i.e. ammonia in water and an organic solvent. In embodiments, the concentration of the base in the alkaline composition may be from about 0.01 to about 0.3 M.

The deposited composition (i.e. as nanoparticles prior to heating or as a thin film/feature after heating) can be exposed to the alkaline composition, wherein the alkaline composition is a gas or a liquid. For example, in some embodiments, the alkaline composition is in the form of a vapor. In other embodiments, the alkaline composition can be dripped upon the deposited composition. In still other embodiments, the deposited composition can be immersed into the alkaline composition.

The deposited composition or feature is heated or dried at a low temperature of from about 70° C. to about 130° C., including from about 85° C. to about 130° C. In other embodiments, the heating/drying is performed at a temperature of from about 80° C. to about 120° C. In particular embodiments, the annealing temperature is lower than 100° C., and may be as low as about 85° C. Such low temperatures compare favorably to annealing temperatures of about 120° C., without the basic solution treatment. Please note that any heating might also be construed as drying if it occurs after the deposited composition is exposed to the alkaline composition. The heating may occur for a period of from about 3 minutes to about 1 hour; 5 minutes to 30 minutes; and 5 minutes to 15 minutes.

The conductivity of the resulting metal-containing elements produced by heating the deposited metal nanoparticle composition and exposing them to an alkaline treatment is, for example, at least one thousand S/cm. In other embodiments, the conductivity is at least ten thousand S/cm, as measured by four-probe method. Advantageously, such high conductivities can be obtained even with metal nanoparticle compositions that have been aged for at least one month or even over three months, for example as occurs when such compositions are stored. These methods thus extend the shelf-life of such compositions.

The metal nanoparticle compositions can be used to form complex, high precision circuitry having good electrical properties. For example, the compositions and methods of the present disclosure can be utilized to form conductive features on any suitable substrate such as plastic, glass, metal, and silicon wafer. The features may have a feature size of as small as 25 μm.

The resulting conductive features can be used as conductive electrodes, conductive pads, conductive lines, conductive tracks, and the like in electronic devices such as a thin film transistor, organic light emitting diodes, RFID (radio frequency identification) tags, photovoltaic, and other electronic devices which require conductive elements or components.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is a semiconductor layer 12 as illustrated herein.

Figure 2:
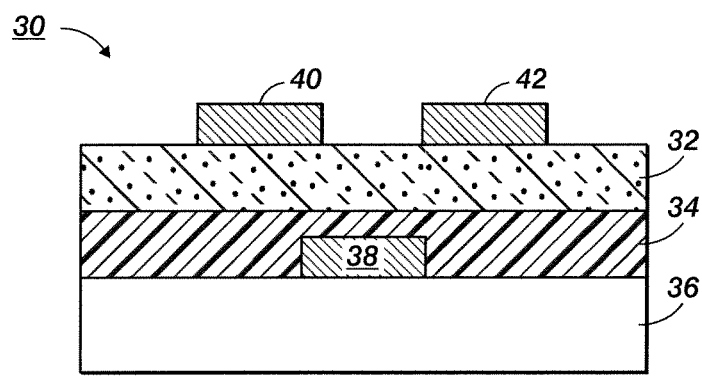
FIG. 2 represents a second embodiment of a thin film transistor fabricated according to the present disclosure.

FIG. 2 schematically illustrates another TFT configuration 30 comprised of a substrate 36, a gate electrode 38, a source electrode 40 and a drain electrode 42, an insulating layer 34, and a semiconductor layer 32.

Figure 3:
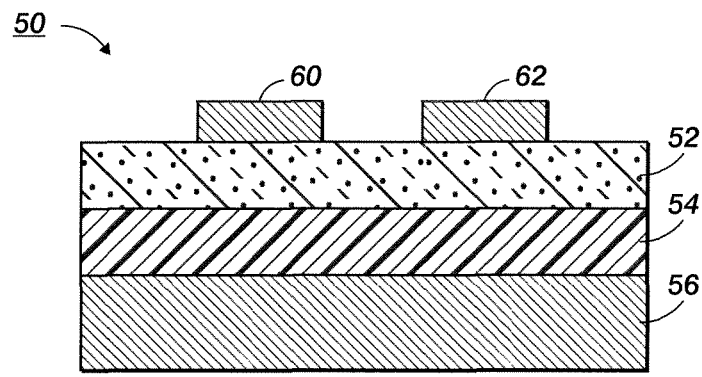
FIG. 3 represents a third embodiment of a thin film transistor fabricated according to the present disclosure.

FIG. 3 schematically illustrates a further TFT configuration 50 comprised of a heavily n-doped silicon wafer 56 which acts as both a substrate and a gate electrode, a thermally grown silicon oxide insulating layer 54, and a semiconductor layer 52, on top of which are deposited a source electrode 60 and a drain electrode 62.

Figure 4:
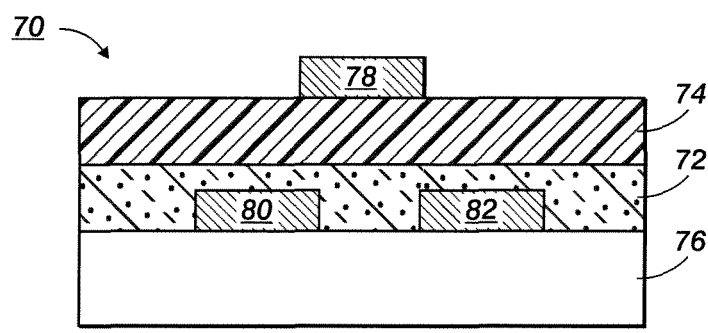
FIG. 4 represents a fourth embodiment of a thin film transistor fabricated according to the present disclosure.

FIG. 4 schematically illustrates an additional TFT configuration 70 comprised of substrate 76, a gate electrode 78, a source electrode 80, a drain electrode 82, a semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and/or the drain electrode are fabricated by embodiments of the present disclosure. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in U.S. Pat. Nos. 6,621,099; 6,770,904; and 6,949,762; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Comparative Example 1

Freshly prepared dodecylamine stabilized silver nanoparticles were used. A 15 wt % dispersion of silver nanoparticles in toluene was prepared and spin coated on a glass slide. The deposited composition was annealed at about 115° C. for 10 minutes resulting in a thin film having a thickness of 94 nm. The conductivity was $3.04 \times 10^4$ S/cm, measured using 4-probe method. Clearly, the freshly prepared dodecylamine stabilized silver nanoparticles showed high conductivity after annealing at processing temperature of about 115° C.

Comparative Example 2

The same batch of silver nanoparticles was used after it was aged for a period of time (over 3 months). A dispersion of the silver nanoparticles in toluene (15 wt %) was prepared and spin coated on a glass slide. The deposited composition was annealed at about 120° C. for up to 20 minutes resulting in a thin film having a thickness of 93 nm. The annealed thin film was not conductive, measured using 4-probe method. Clearly the conductivity of the aged dodecylamine stabilized silver nanoparticles was reduced significantly after aging.

Example 1

The aged dispersion of Comparative Example 2 was used again. The deposited composition was heated at about 110° C. for 10 minutes, while concurrently being subjected to a basic vapor of ammonium hydroxide, the vapor being made by dripping several drops of ammonium hydroxide solution on the surface of a hot plate. After heating in these conditions, the conductivity of the resulting thin film was $3.82 \times 10^4$ S/cm, measured by using 4-probe method.

Example 2

The aged dispersion of Comparative Example 2 was used again. The deposited composition was immersed into a diluted ammonium hydroxide solution in acetone for 1-2 minutes, and then heated at about 95° C. for 10 minutes. The resulting film (84 nm thickness) became highly conductive and its conductivity reached $3.06 \times 10^4$ S/cm.

Example 3

The aged dispersion of Comparative Example 2 was used again. The deposited composition was annealed at about 95° C. for 10 minutes and the annealed thin film (86 nm thickness) was not conductive. The thin film was then immersed in a diluted ammonium hydroxide solution in acetone for about 1-2 minutes, then dried at about 95° C. for 10 minutes. The thin film became very conductive and its conductivity reached $4.27 \times 10^4$ S/cm.

Example 4

The aged dispersion of Comparative Example 2 was used again. The deposited composition was annealed at about 85° C. for 15 minutes and the annealed thin film (88 nm thickness) was not conductive. The thin film was then immersed in a diluted ammonium hydroxide solution in acetone for about 1-2 minutes, then air dried for about 10 minutes without heating. The resulting thin film became highly conductive and its conductivity reached $4.87 \times 10^3$ S/cm. The conductivity increased to $1.11 \times 10^4$ S/cm after being kept in the air overnight at room temperature for further drying.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A process for making a conductive feature on an electronic device, comprising:
    depositing a composition upon a substrate, the composition comprising silver nanoparticles having an organic stabilizer on the surface thereof, resulting in a deposited composition;
    heating the deposited composition at a temperature of lower than 100° C.; and
    exposing the deposited composition to an alkaline composition, the alkaline composition comprising a base and a solvent, resulting in the formation of the conductive feature, wherein the alkaline composition is an aqueous solution of ammonium hydroxide and an organic solvent.

2. The process of claim 1, wherein the heating of the deposited composition and the exposing of the deposited composition to an alkaline composition are concurrent.

3. The process of claim 1, wherein the deposited composition is exposed to the alkaline composition prior to the heating.

4. The process of claim 1, wherein the deposited composition is heated prior to the exposure to the alkaline composition.

5. The process of claim 1, wherein the organic solvent of the alkaline composition is selected from the group consisting of a hydrocarbon solvent, an alcohol, an ether, tetrahydrofuran, chlorobenzene, dichlorobenzene, trichlorobenzene, nitrobenzene, cyanobenzene, acetonitrile, and mixtures thereof.

6. The process of claim 1, wherein the heating occurs for a period of from about 3 minutes to about 1 hour.

7. The process of claim 1, wherein the organic stabilizer is dodecylamine.

8. A process for increasing the conductivity of a conductive feature, comprising:
    providing a composition comprising silver nanoparticles with an organoamine stabilizer on the surface of the metal nanoparticles;
    depositing the composition on a substrate, resulting in a deposited composition;
    annealing the deposited composition at a temperature of from about 70° C. to about 100° C.; and
    exposing the deposited composition to an ammonium hydroxide composition, resulting in the formation of the conductive feature.

9. A process for making a conductive feature on an electronic device, comprising:
    depositing a composition upon a substrate, the composition comprising silver nanoparticles having an organic stabilizer on the surface thereof, resulting in a deposited composition;
    heating the deposited composition at a temperature of lower than 100° C.; and exposing the deposited composition to an alkaline composition, the alkaline composition comprising a base and a solvent, resulting in the formation of the conductive feature, wherein the base is selected from the group consisting of sodium hydroxide, potassium hydroxide, calcium hydroxide, magnesium hydroxide, ammonia, sodium carbonate, sodium acetate, and imidazole.

* * * * *